(12) United States Patent
Tabata et al.

(10) Patent No.: US 11,813,860 B2
(45) Date of Patent: Nov. 14, 2023

(54) DRIVE CIRCUIT AND LIQUID EJECTING APPARATUS

(71) Applicant: Seiko Epson Corporation, Tokyo (JP)

(72) Inventors: Kunio Tabata, Shiojiri (JP); Noritaka Ide, Shiojiri (JP); Shoichiro Yokoo, Matsumoto (JP)

(73) Assignee: SEIKO EPSON CORPORATION

( * ) Notice: Subject to any disclaimer, the term of this patent is extended or adjusted under 35 U.S.C. 154(b) by 163 days.

(21) Appl. No.: 17/537,596

(22) Filed: Nov. 30, 2021

(65) Prior Publication Data

US 2022/0169014 A1 Jun. 2, 2022

(30) Foreign Application Priority Data

Dec. 1, 2020 (JP) ................................. 2020-199479

(51) Int. Cl.
*B41J 2/045* (2006.01)
*H03K 17/687* (2006.01)

(52) U.S. Cl.
CPC ......... *B41J 2/04541* (2013.01); *B41J 2/0455* (2013.01); *B41J 2/04501* (2013.01); *B41J 2/04581* (2013.01); *H03K 17/6871* (2013.01); *B41J 2/04596* (2013.01)

(58) Field of Classification Search
CPC .... B41J 2/0455; B41J 2/0452; B41J 2/04588; B41J 2/04581; B41J 2/04501; B41J 2/04596; B41J 2/04541; B41J 2/0459; B41J 2/04591; H03K 2217/0081; H03K 17/6871

See application file for complete search history.

(56) References Cited

U.S. PATENT DOCUMENTS

| | | |
|---|---|---|
| 2009/0195576 A1 | 8/2009 | Oshima |
| 2010/0127777 A1 | 5/2010 | Yoshino et al. |
| 2010/0188452 A1 | 7/2010 | Oshima |
| 2013/0162351 A1 | 6/2013 | Yoshino et al. |
| 2015/0273821 A1* | 10/2015 | Abe ..................... B41J 2/14233 347/10 |
| 2017/0057221 A1* | 3/2017 | Nozawa ................. B41J 2/0455 |
| 2018/0178510 A1* | 6/2018 | Nakajima ............ B41J 2/04588 |

FOREIGN PATENT DOCUMENTS

| | | |
|---|---|---|
| JP | 2009-166349 A | 7/2009 |
| JP | 2010-130340 A | 6/2010 |

* cited by examiner

*Primary Examiner* — Kristal Feggins
(74) *Attorney, Agent, or Firm* — Harness, Dickey & Pierce, P.L.C.

(57) ABSTRACT

A first switching circuit, a second switching circuit, a first bootstrap circuit that is coupled to the first switching circuit and the second switching circuit, and a smoothing circuit and outputs a drive signal are provided, in which the second switching circuit includes a second gate driver that outputs a third gate signal and a fourth gate signal, a third transistor of which the first voltage is supplied, and which is driven based on the third gate signal, a fourth transistor which is driven based on the fourth gate signal, and a second bootstrap circuit that includes a second capacitive element supplying a third voltage to the second gate driver and coupled to a second output point and the second gate driver, and a second diode of which the first voltage is supplied and which is coupled to the second capacitive element.

10 Claims, 7 Drawing Sheets

DRIVE CIRCUIT AND LIQUID EJECTING APPARATUS

The present application is based on, and claims priority from JP Application Serial Number 2020-199479, filed Dec. 1, 2020, the disclosure of which is hereby incorporated by reference herein in its entirety.

BACKGROUND

1. Technical Field

The present disclosure relates to a drive circuit and a liquid ejecting apparatus.

2. Related Art

As an Ink jet printer that ejects ink to print an image and a document, a printer that uses a driving element such as a piezoelectric element (for example, piezo element) is known. Such a piezoelectric element is provided in a head unit corresponding to each of a plurality of nozzles, and each of the piezoelectric elements is driven according to a drive signal. As a result, a predetermined amount of ink (liquid) is ejected from the nozzle at a predetermined timing, and dots are formed on a medium. Since the piezoelectric element is a capacitive load like a capacitor when viewed electrically, it is necessary to supply a sufficient current in order to operate the piezoelectric element of each nozzle. Therefore, the piezoelectric element is driven by amplifying a source signal by an amplifier circuit and supplying the source signal to the head unit as a drive signal.

JP-A-2009-166349 describes a drive circuit including a modulation circuit that modulates a reference drive signal and a plurality of power amplifier circuits that power-amplify a signal output by the modulation circuit as a drive circuit that outputs a drive signal, and a liquid ejecting apparatus equipped with the drive circuit is disclosed.

However, from the viewpoint of improving waveform accuracy of the drive signal output by the drive circuit, the drive circuit described in JP-A-2009-166349 is not sufficient, and there is room for further improvement.

SUMMARY

According to an aspect of the present disclosure, there is provided a drive circuit that outputs a drive signal driving a drive portion, the circuit including a first switching circuit that outputs a first pulse signal from a first output point; a second switching circuit that outputs a second pulse signal from a second output point; a first bootstrap circuit that is electrically coupled to the first switching circuit and the second switching circuit and outputs a first voltage to the second switching circuit; and a smoothing circuit that smooths the second pulse signal and outputs the drive signal, in which the first bootstrap circuit includes a first capacitive element of which one end is electrically coupled to the first output point, and a first diode of which a second voltage is supplied to an anode terminal, and a cathode terminal is electrically coupled to the other end of the first capacitive element, the first switching circuit includes a first gate driver that outputs a first gate signal and a second gate signal based on a reference drive signal which is a reference of the drive signal, a first transistor of which the second voltage is supplied to one end, and the other end is electrically coupled to the first output point, and which is driven based on the first gate signal, and a second transistor of which one end is electrically coupled to the first output point and which is driven based on the second gate signal, the second switching circuit includes a second gate driver that outputs a third gate signal and a fourth gate signal based on the reference drive signal, a third transistor of which the first voltage is supplied to one end, and the other end is electrically coupled to the second output point, and which is driven based on the third gate signal, a fourth transistor of which one end is electrically coupled to the second output point, and the other end is electrically coupled to the first output point, and which is driven based on the fourth gate signal, and a second bootstrap circuit that supplies a third voltage to the second gate driver, and the second bootstrap circuit includes a second capacitive element of which one end is electrically coupled to the second output point and the other end is electrically coupled to the second gate driver, and a second diode of which the first voltage is supplied to an anode terminal and a cathode terminal is electrically coupled to the other end of the second capacitive element.

According to another aspect of the present disclosure, there is provided a liquid ejecting apparatus including an ejecting portion that ejects a liquid; and a drive circuit that outputs a drive signal driving the ejecting portion, in which the drive circuit includes a first switching circuit that outputs a first pulse signal from a first output point; a second switching circuit that outputs a second pulse signal from a second output point; a first bootstrap circuit that is electrically coupled to the first switching circuit and the second switching circuit and outputs a first voltage to the second switching circuit; and a smoothing circuit that smooths the second pulse signal and outputs the drive signal, in which the first bootstrap circuit includes a first capacitive element of which one end is electrically coupled to the first output point, and a first diode of which a second voltage is supplied to an anode terminal, and a cathode terminal is electrically coupled to the other end of the first capacitive element, the first switching circuit includes a first gate driver that outputs a first gate signal and a second gate signal based on a reference drive signal which is a reference of the drive signal, a first transistor of which the second voltage is supplied to one end, and the other end is electrically coupled to the first output point, and which is driven based on the first gate signal, and a second transistor of which one end is electrically coupled to the first output point and which is driven based on the second gate signal, the second switching circuit includes a second gate driver that outputs a third gate signal and a fourth gate signal based on the reference drive signal, a third transistor of which the first voltage is supplied to one end, and the other end is electrically coupled to the second output point, and which is driven based on the third gate signal, a fourth transistor of which one end is electrically coupled to the second output point, and the other end is electrically coupled to the first output point, and which is driven based on the fourth gate signal, and a second bootstrap circuit that supplies a third voltage to the second gate driver, and the second bootstrap circuit includes a second capacitive element of which one end is electrically coupled to the second output point and the other end is electrically coupled to the second gate driver, and a second diode of which the first voltage is supplied to an anode terminal and a cathode terminal is electrically coupled to the other end of the second capacitive element.

DESCRIPTION OF EXEMPLARY EMBODIMENTS

Hereinafter, preferred embodiments of the present disclosure will be described with reference to the drawings. The drawings used are for convenience of description. The embodiments described below do not unreasonably limit the content of the present disclosure described in the aspects. In addition, not all of the configurations described below are essential constituent requirements of the present disclosure.

1. First Embodiment 1.1. Overview of Liquid Ejecting Apparatus

Figure 1:
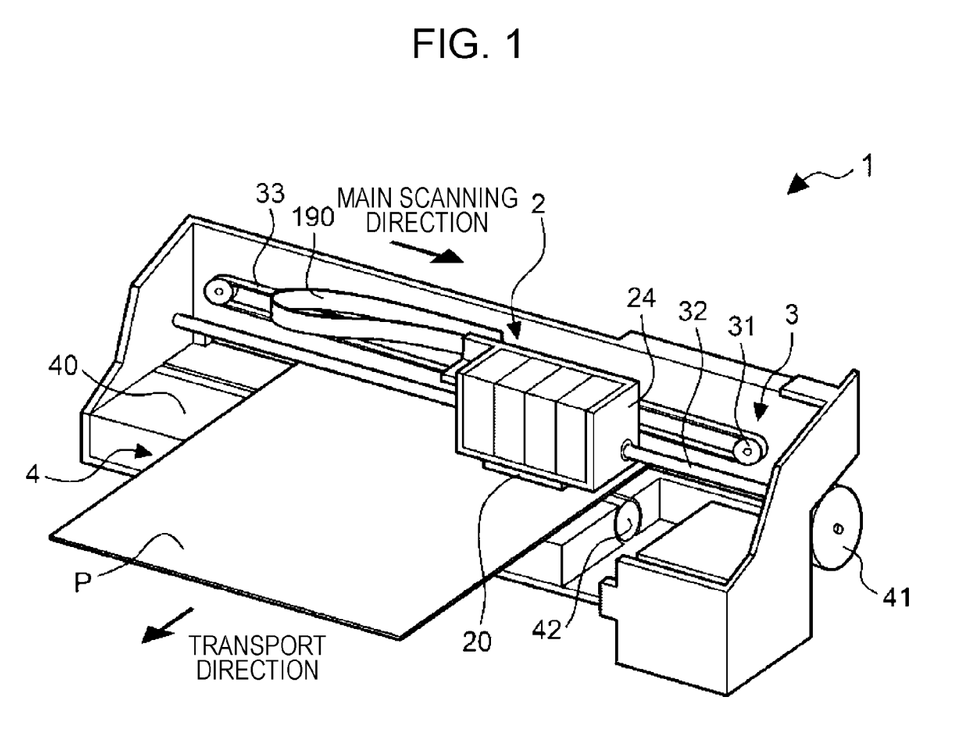
FIG. 1 is a view illustrating a structure of a liquid ejecting apparatus.

FIG. 1 is a view illustrating a structure of a liquid ejecting apparatus 1. As illustrated in FIG. 1, the liquid ejecting apparatus 1 is provided with a moving unit 3 that reciprocates a moving object 2 in a direction along a main scanning direction.

The moving unit 3 includes a carriage motor 31 that is a driving source for the movement of the moving object 2, a carriage guide shaft 32 having both ends fixed, and a timing belt 33 extending substantially parallel to the carriage guide shaft 32 and driven by the carriage motor 31.

The moving object 2 includes a carriage 24. The carriage 24 is reciprocally supported by the carriage guide shaft 32 and is fixed to a portion of the timing belt 33. As a result, the carriage motor 31 travels forward and reverse on the timing belt 33, so that the moving object 2 is guided by the carriage guide shaft 32 and reciprocates. A head unit 20 is provided in a portion of the moving object 2 facing a medium P. Multiple nozzles for ejecting ink as a liquid are located on a surface of the head unit 20 facing the medium P. Various control signals for controlling the operation of the head unit 20 are supplied to the head unit 20 via a flexible cable 190.

In addition, the liquid ejecting apparatus 1 is provided with a transport unit 4 for transporting the medium P on a platen 40 along a transport direction. The transport unit 4 includes a transport motor 41 that is a driving source for transporting the medium P, and a transport roller 42 that is rotated by the transport motor 41 and transports the medium P along the transport direction.

In the liquid ejecting apparatus 1 configured as described above, ink is ejected from the head unit 20 to the medium P at the timing when the medium P is transported by the transport unit 4, so that a desired image is formed on the surface of the medium P.

Figure 2:
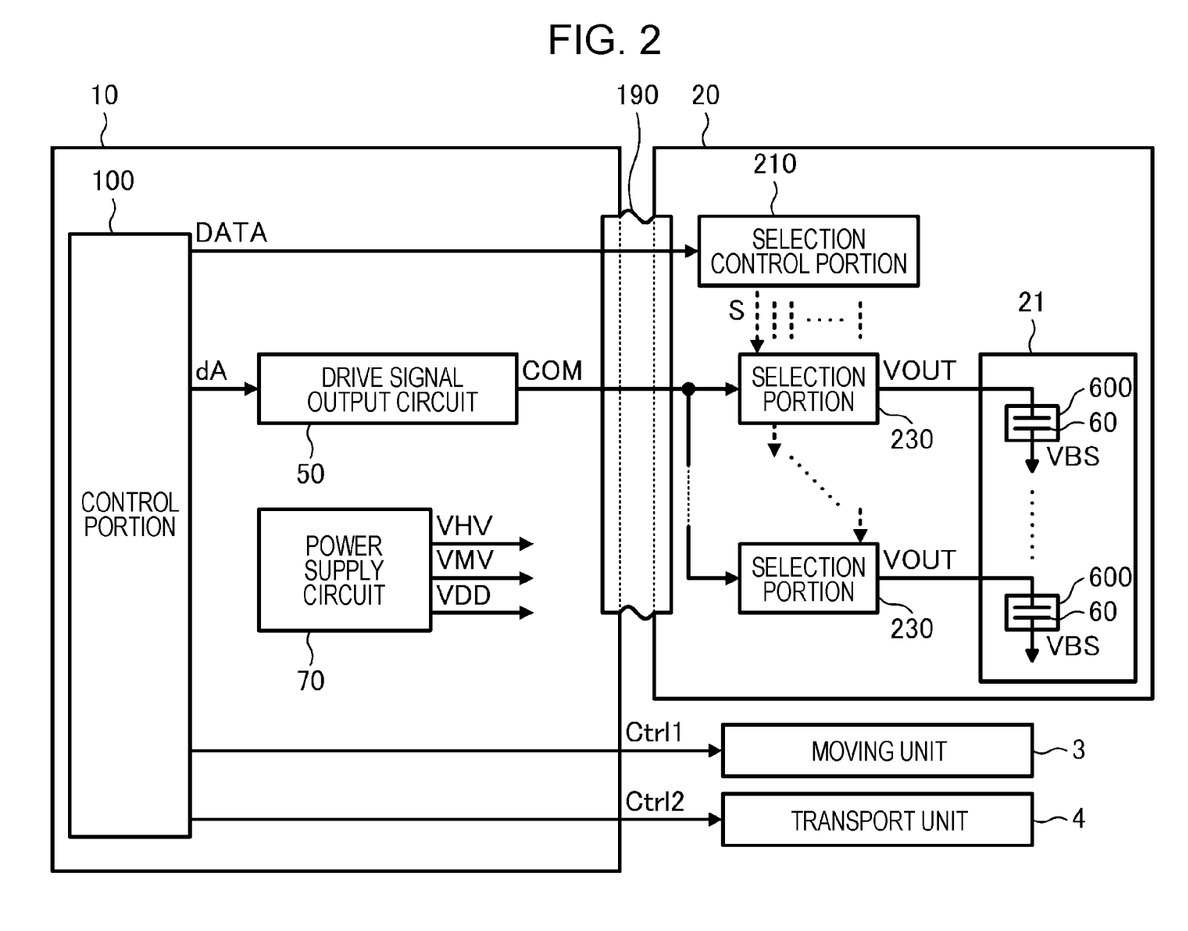
FIG. 2 is a diagram illustrating a functional configuration of the liquid ejecting apparatus.

Next, a functional configuration of the liquid ejecting apparatus 1 will be described. FIG. 2 is a diagram illustrating the functional configuration of the liquid ejecting apparatus 1. As illustrated in FIG. 2, the liquid ejecting apparatus 1 is provided with a control unit 10, a head unit 20, a moving unit 3, a transport unit 4, and a flexible cable 190 that electrically couples the control unit 10 and the head unit 20.

The control unit 10 includes a control portion 100, a drive signal output circuit 50, and a power supply circuit 70.

The power supply circuit 70 generates voltages VHV, VMV, and VDD having a predetermined voltage value from a commercial AC power supply supplied from the outside of the liquid ejecting apparatus 1, and outputs the voltages to the configuration of the corresponding liquid ejecting apparatus 1. Here, the voltage VHV in the present embodiment is a DC voltage having a potential larger than the voltages VMV and VDD, for example, a DC voltage of 42 V, the voltage VMV is a DC voltage having a potential larger than the voltage VDD, for example, a DC voltage of 21V, and the voltage VDD is, for example, a DC voltage of 3.3 V. The power supply circuit 70 may output signals having different voltage values in addition to the voltages VHV, VMV, and VDD. In addition, the power supply circuit 70 may include an AC/DC converter that generates the voltage VHV from a commercial AC power supply and a DC/DC converter that generates the voltages VMV, and VDD from the voltage VHV.

An image data is supplied to the control portion 100 from an external device (not illustrated) provided outside the liquid ejecting apparatus 1, for example, from a host computer or the like. The control portion 100 generates various control signals for controlling each part of the liquid ejecting apparatus 1 by performing various image processing and the like on the supplied image data, and outputs the various control signals to the corresponding configurations.

Specifically, the control portion 100 generates a control signal Ctrl1 for controlling the reciprocating movement of the moving object 2 by the moving unit 3 and outputs the control signal Ctrl1 to the carriage motor 31 included in the moving unit 3. In addition, the control portion 100 generates a control signal Ctrl2 for controlling the transport of the medium P by the transport unit 4, and outputs the control signal Ctrl2 to the transport motor 41 included in the transport unit 4. As a result, the reciprocating movement of the moving object 2 along the main scanning direction and the transport of the medium P along the transport direction are controlled, and the head unit 20 can eject the ink on a desired position of the medium P. The control portion 100 may supply the control signal Ctrl1 to the moving unit 3 via a carriage motor driver (not illustrated), or may supply the control signal Ctrl2 to the transport unit 4 via a transport motor driver (not illustrated).

In addition, the control portion 100 outputs reference drive data dA to the drive signal output circuit 50. Here, the reference drive data dA is a digital signal including data that defines the waveform of the drive signal COM supplied to the head unit 20. The drive signal output circuit 50 converts the input reference drive data dA into an analog signal, and then amplifies the converted signal to generate a drive signal COM and supplies the drive signal COM to the head unit 20. The configuration and operation details of the drive signal output circuit 50 will be described later.

In addition, the control portion 100 generates a drive data signal DATA for controlling the operation of the head unit 20 and outputs the drive data signal DATA to the head unit 20. The head unit 20 includes a selection control portion 210, a plurality of selection portions 230, and an ejecting head 21. In addition, the ejecting head 21 includes a plurality of ejecting portions 600 including a piezoelectric element 60. Each of the plurality of selection portions 230 is provided corresponding to the piezoelectric element 60 included in each of a plurality of ejecting portions 600 included in the ejecting head 21.

The drive data signal DATA is input to the selection control portion 210. The selection control portion 210 generates a selection signal S instructing each of the selection portions 230 whether to select or not select the drive signal COM based on the input drive data signal DATA, and outputs the selection signal S to each of the plurality of selection portions 230. Each of the plurality of selection portions 230 selects or does not select the drive signal COM as a drive signal VOUT based on the input selection signal S. As a result, the selection portion 230 generates a drive signal VOUT based on the drive signal COM and supplies the drive signal VOUT to one end of the piezoelectric element 60 included in the corresponding ejecting portion 600 included in the ejecting head 21. In addition, a reference voltage signal VBS is supplied to the other end of the piezoelectric element 60. The reference voltage signal VBS is, for example, a signal having a DC voltage of 5 V or a ground potential, and functions as a reference potential of the piezoelectric element 60 that is driven according to the drive signal VOUT.

The piezoelectric element 60 is provided corresponding to each of the plurality of nozzles in the head unit 20. The piezoelectric element 60 is driven according to the potential difference between the drive signal VOUT supplied to one end and the reference voltage signal VBS supplied to the other end. As a result, ink is ejected from a nozzle described later provided corresponding to the piezoelectric element 60.

Although FIG. 2 illustrates when the head unit 20 is equipped with one ejecting head 21, the liquid ejecting apparatus 1 may include a plurality of ejecting heads 21 according to the number of types of ink to be ejected and the like.

1.2. Configuration of Ejecting Portion

Figure 3:
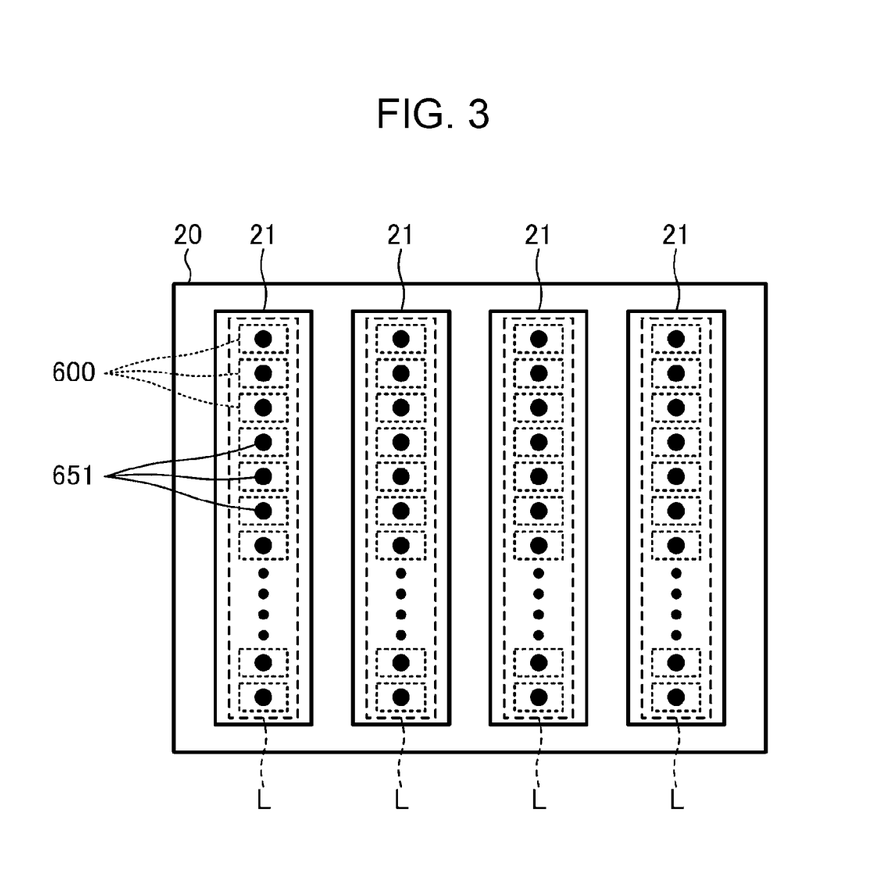
FIG. 3 is a diagram illustrating an example of arrangement of a plurality of ejecting portions in a head unit.

FIG. 3 is a diagram illustrating an example of arrangement of the plurality of ejecting portions 600 in the head unit 20. FIG. 3 illustrates when the head unit 20 includes four ejecting heads 21.

As illustrated in FIG. 3, the ejecting head 21 includes the plurality of ejecting portions 600 provided in a row in one direction. That is, the head unit 20 is formed with as many nozzle rows L as the number of ejecting heads 21 in which nozzles 651 included in the ejecting portion 600 are arranged in one direction. The arrangement of the nozzles 651 in the nozzle row L included in the ejecting head 21 is not limited to one row. For example, in the ejecting head 21, a plurality of nozzles 651 may have nozzle rows L in which the even-numbered nozzles 651 and the odd-numbered nozzles 651 counted from the ends are arranged in a staggered manner so as that the positions are different from each other, or a plurality of nozzles 651 may be arranged side by side in two or more rows to include the nozzle rows L.

Figure 4:
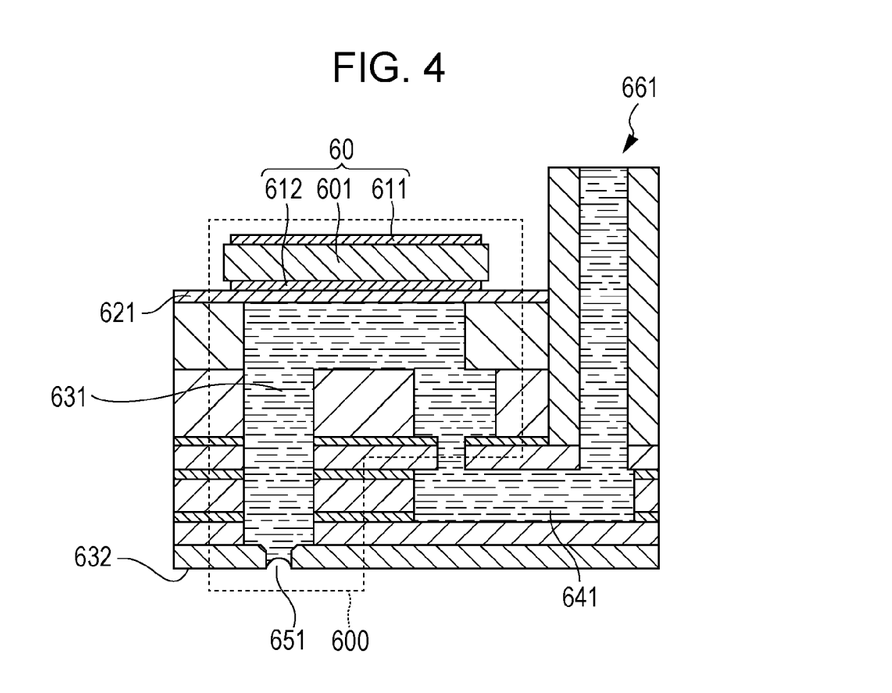
FIG. 4 is a diagram illustrating a schematic configuration of the ejecting portion.

Next, an example of the configuration of the ejecting portion 600 will be described. FIG. 4 is a diagram illustrating a schematic configuration of the ejecting portion 600. As illustrated in FIG. 4, the ejecting portion 600 includes a piezoelectric element 60, a diaphragm 621, a cavity 631, and a nozzle 651. The cavity 631 is filled with ink supplied from a reservoir 641. In addition, ink is introduced into the reservoir 641 from an ink cartridge (not illustrated) via a supply port 661. That is, the ink stored in the corresponding ink cartridge is supplied to the cavity 631 via the reservoir 641.

The diaphragm 621 is displaced by driving the piezoelectric element 60 provided on the upper surface in FIG. 4. As the diaphragm 621 is displaced, the internal volume of the cavity 631 filled with ink is expanded and is reduced. That is, the diaphragm 621 functions as a diaphragm that changes the internal volume of the cavity 631. The nozzle 651 is an opening portion provided in a nozzle plate 632 and communicates with the cavity 631. As the internal volume of the cavity 631 changes, the amount of ink according to the change in the internal volume is introduced into the cavity 631 and ejected from the nozzle 651.

The piezoelectric element 60 has a structure in which a piezoelectric body 601 is interposed between a pair of electrodes 611 and 612. In the piezoelectric body 601 having such a structure, a central portion of the electrodes 611 and 612 bends in the vertical direction together with the diaphragm 621 according to the potential difference of the voltage supplied by the electrodes 611 and 612. Specifically, the drive signal VOUT is supplied to the electrode 611 of the piezoelectric element 60, and the reference potential signal is supplied to the electrode 612. When the voltage level of the drive signal VOUT supplied to the electrode 611 is low, the corresponding piezoelectric element 60 bends upward, and when the voltage level of the drive signal VOUT supplied to the electrode 611 is high, the corresponding piezoelectric element 60 bends downward.

In the ejecting portion 600 configured as described above, the piezoelectric element 60 bends upward, so that the diaphragm 621 is displaced upward and the internal volume of the cavity 631 is expanded. As a result, ink is drawn from the reservoir 641. On the other hand, when the piezoelectric element 60 bends downward, the diaphragm 621 is displaced downward, and the internal volume of the cavity 631 is reduced. As a result, an amount of ink according to the degree of reduction is ejected from the nozzle 651. Here, the piezoelectric element 60 is not limited to the configuration of a bending vibration illustrated in FIG. 4, and may have a structure using a longitudinal vibration, for example.

Here, the ejecting portion 600 including the piezoelectric element 60 is an example of the drive portion, and the drive signal COM that is a reference of the drive signal VOUT that drives the drive portion is an example of the drive signal. The drive signal output circuit 50 that outputs the drive signal COM driving the ejecting portion 600 is an example of the drive circuit. Considering that the drive signal VOUT is generated by selecting or not selecting the drive signal COM, the drive signal VOUT is also an example of the drive signal in a broad sense.

1.3. Configuration of Drive Signal Output Circuit

As described above, the piezoelectric element 60, which is driven by the ejecting portion 600 included in the head unit 20 to eject ink, is driven by the drive signal VOUT based on the drive signal COM generated by the drive signal output circuit 50. The configuration and operation of the drive signal output circuit 50 that generates and outputs the drive signal COM which is the reference of such a drive signal VOUT will be described.

1.3.1 Voltage Waveform of Drive Signal COM

Figure 5:
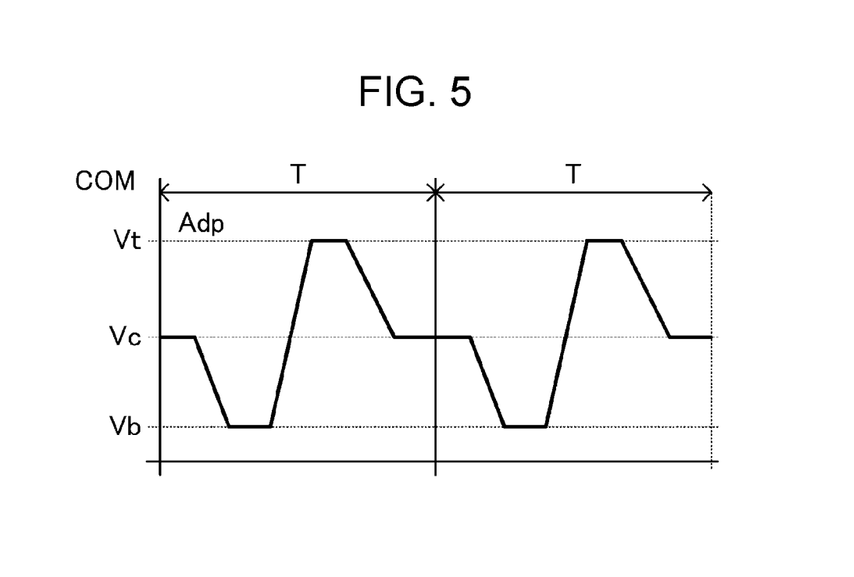
FIG. 5 is a graph illustrating an example of a waveform of a drive signal COM.

First, an example of a waveform of the drive signal COM generated by the drive signal output circuit 50 will be described. FIG. 5 is a graph illustrating an example of the waveform of the drive signal COM. As illustrated in FIG. 5, the drive signal COM is a signal including a trapezoidal waveform Adp for each period T. The trapezoidal waveform Adp included in the drive signal COM has a certain period at a voltage Vc, a certain period at a voltage Vb with a lower potential than that in the voltage Vc located after a certain period at the voltage Vc, a certain period at a voltage Vt with a higher potential than that in the voltage Vc located after a certain period at the voltage Vb, and a certain period at the voltage Vc located after a certain period at the voltage Vt. That is, the drive signal COM includes a trapezoidal waveform Adp that starts at a voltage Vc and ends at a voltage Vc.

Here, the voltage Vc functions as a reference potential that serves as a reference for the displacement of the piezoelectric element 60 driven by the drive signal COM. When the voltage value of the drive signal COM supplied to the piezoelectric element 60 changes from the voltage Vc to the voltage Vb, the piezoelectric element 60 bends upward in FIG. 4, and as a result, the diaphragm 621 is displaced upward as illustrated in FIG. 4. When the diaphragm 621 is displaced upward, the internal volume of the cavity 631 is expanded, and ink is drawn from the reservoir 641 into the cavity 631. Thereafter, when the voltage value of the drive signal COM supplied to the piezoelectric element 60 changes from the voltage Vb to the voltage Vt, the piezoelectric element 60 bends downward as illustrated in FIG. 4, and as a result, the diaphragm 621 is displaced downward as illustrated in FIG. 4. When the diaphragm 621 is displaced downward, the internal volume of the cavity 631 is reduced, and the ink stored in the cavity 631 is ejected from the nozzle 651. In addition, after the ink is ejected from the nozzle 651 by driving the piezoelectric element 60, the ink or the diaphragm 621 in the vicinity of the nozzle 651 may continue to vibrate for a certain period. The certain period at the voltage Vc included in the drive signal COM also functions as a period for stopping the vibration not contributing to the ejection of such an ink or the ink generated in the diaphragm 621.

1.3.2 Configuration of Drive Signal Output Circuit

Figure 6:
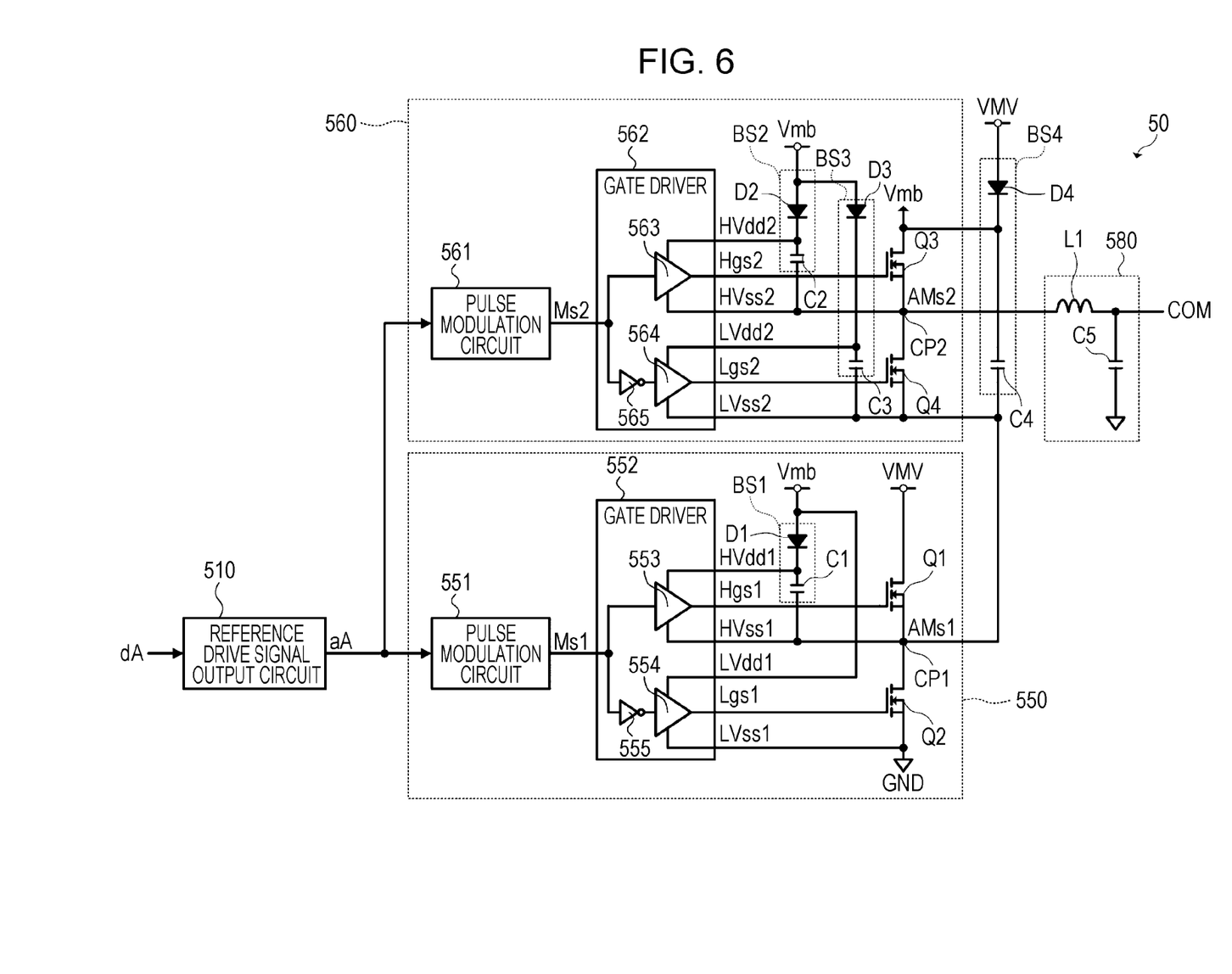
FIG. 6 is a diagram illustrating a functional configuration of a drive signal output circuit.

Next, the configuration of the drive signal output circuit 50 that generates and outputs the drive signal COM will be described. FIG. 6 is a diagram illustrating a functional configuration of the drive signal output circuit 50. As illustrated in FIG. 6, the drive signal output circuit 50 includes a reference drive signal output circuit 510, a first digital amplifier circuit 550, a second digital amplifier circuit 560, a demodulation circuit 580, and a bootstrap circuit BS4.

The reference drive data dA, which is a digital signal, is input from the control portion 100 to the reference drive signal output circuit 510. The reference drive signal output circuit 510 performs digital-to-analog conversion of the input reference drive data dA, and then outputs the converted analog signal as a reference drive signal aA. That is, the reference drive signal output circuit 510 includes a digital to analog (D/A) converter. The voltage amplitude of the reference drive signal aA is, for example, 1 to 2 V, and the drive signal output circuit 50 outputs a signal obtained by amplifying the reference drive signal aA as a drive signal COM. That is, the reference drive signal aA corresponds to a target signal before amplification of the drive signal COM.

The first digital amplifier circuit 550 includes a pulse modulation circuit 551, a gate driver 552, a diode D1, a capacitor C1, and transistors Q1 and Q2. The first digital amplifier circuit 550 generates an amplification modulation signal AMs1 based on the reference drive signal aA input from the reference drive signal output circuit 510, and outputs the amplification modulation signal AMs1 from the midpoint CP1.

The pulse modulation circuit 551 generates a modulation signal Ms1 by pulse-modulating the reference drive signal aA input from the reference drive signal output circuit 510, and outputs the generated modulation signal Ms1 to the first digital amplifier circuit 550. Specifically, the pulse modulation circuit 551 compares the input reference drive signal aA with a predetermined triangular wave signal. The modulation signal Ms1 which is the H-level when the reference drive signal aA is larger than the predetermined triangular wave signal and is the L-level when the reference drive signal aA is smaller than the predetermined triangular wave signal is output. The pulse modulation circuit 551 may generate a pulse density modulation signal (PDM signal) obtained by modulating the reference drive signal aA by a pulse density modulation (PDM) method, and output the PDM signal as the modulation signal Ms1 to the first digital amplifier circuit 550. Here, the triangular wave signal used for comparison with the reference drive signal aA in the pulse modulation circuit 551 is a signal having a maximum value of the potential of the reference drive signal aA corresponding to the case where the potential of the drive signal COM is the potential of the voltage VMV.

The modulation signal Ms1 output by the pulse modulation circuit 551 is input to the gate driver 552. The gate driver 552 outputs a gate signal Hgs1 for driving the transistor Q1 and a gate signal Lgs1 for driving the transistor Q2 based on the logic level of the input modulation signal Ms1. That is, the gate driver 552 outputs the gate signal Hgs1 and the gate signal Lgs1 based on the reference drive signal aA which is the reference of the drive signal COM.

The transistors Q1 and Q2 are both configured to include N-channel MOS-FETs. The gate signal Hgs1 output by the gate driver 552 is input to a gate terminal of the transistor Q1. In addition, a voltage VMV is supplied to a drain terminal of the transistor Q1, and a source terminal of the transistor Q1 is coupled to the midpoint CP1. The gate signal Lgs1 output by the gate driver 552 is input to a gate terminal of the transistor Q2. In addition, a drain terminal of the transistor Q2 is coupled to the midpoint CP1, and the ground potential GND is supplied to a source terminal of the transistor Q2. That is, in the transistor Q1, the voltage VMV is supplied to the drain terminal at one end, the source terminal at the other end is electrically coupled to the midpoint CP1, and the transistor Q1 is driven based on the gate signal Hgs1. In the transistor Q2, the drain terminal at one end is electrically coupled to the midpoint CP1 and the transistor Q2 is driven based on the gate signal Lgs1. The first digital amplifier circuit 550 outputs the generated signal to the midpoint CP1 to which the transistor Q1 and the transistor Q2 are coupled as the amplification modulation signal AMs1.

Here, the operation of the gate driver 552 that outputs the gate signal Hgs1 and the gate signal Lgs1 based on the modulation signal Ms1 will be described. The gate driver 552 includes gate drive circuits 553 and 554 and an inverter circuit 555. The modulation signal Ms1 input to the gate driver 552 is input to the gate drive circuit 553 and also input to the gate drive circuit 554 via the inverter circuit 555. That is, the signal input to the gate drive circuit 553 and the signal input to the gate drive circuit 554 are exclusively at the H-level. Here, the signal that is exclusively H-level means that the H-level signal is not simultaneously input to the gate drive circuit 553 and the gate drive circuit 554. That is, it does not exclude when the L-level signal is simultaneously input to the gate drive circuit 553 and the gate drive circuit 554.

The low potential side power supply terminal of the gate drive circuit 553 is coupled to the midpoint CP1. Therefore, the potential signal of the midpoint CP1 is supplied as a voltage HVss1 to the low potential side power supply terminal of the gate drive circuit 553. In addition, the high potential side power supply terminal of the gate drive circuit 553 is coupled to the cathode terminal of the diode D1 in which the voltage Vmb output by the bootstrap circuit BS4 described later is supplied to the anode terminal, and is also coupled to one end of the capacitor C1. The other end of the capacitor C1 is coupled to the midpoint CP1. That is, the high potential side input terminal of the gate drive circuit 553 is configured to include a bootstrap circuit BS1 including a capacitor C1 that functions as a bootstrap capacitor. In other words, the first digital amplifier circuit 550 includes the capacitor C1 of which one end is electrically coupled to the midpoint CP1 and the other end is electrically coupled to the gate driver 552, the diode D1 in which a voltage Vmb is supplied to the anode terminal and the cathode terminal is electrically coupled to the other end of the capacitor C1, and the bootstrap circuit BS1 that supplies the voltage HVdd1 to the gate driver 552. The voltage HVdd1 having a potential larger than the voltage HVss1 only by the voltage Vmb is supplied to the high potential side input terminal of the gate drive circuit 553 by the bootstrap circuit BS1, with the voltage HVss1 which is the potential of the midpoint CP1 as a reference potential.

Therefore, when the H-level modulation signal Ms1 is input to the gate drive circuit 553, the gate drive circuit 553 outputs the H-level gate signal Hgs1 having a potential based on the voltage HVdd1 which is larger than the potential of the midpoint CP1 only by a voltage Vmb. When the L-level modulation signal Ms1 is input to the gate drive circuit 553, the gate drive circuit 553 outputs the L-level gate signal Hgs1 having a potential based on the voltage HVss1 which is the potential of the midpoint CP1.

A ground potential GND signal is supplied as a voltage LVss1 to the low potential side power supply terminal of the gate drive circuit 554. In addition, a voltage Vmb is supplied as a voltage LVdd1 to the high potential side power supply terminal of the gate drive circuit 554. Therefore, when the H-level signal in which the logic level of the L-level modulation signal Ms1 is inverted by the inverter circuit 555 is input to the gate drive circuit 554, the gate drive circuit 554 outputs an H-level gate signal Lgs1 having a potential based on the voltage LVdd1 which is a voltage Vmb. When the L-level signal in which the logic level of the H-level modulation signal Ms1 is inverted by the inverter circuit 555 is input to the gate drive circuit 554, the gate drive circuit 554 outputs an L-level gate signal Lgs1 having a potential based on the voltage LVss1 which is the ground potential GND.

The second digital amplifier circuit 560 includes a pulse modulation circuit 561, a gate driver 562, diodes D2 and D3, capacitors C2 and C3, and transistors Q3 and Q4. The second digital amplifier circuit 560 generates the amplification modulation signal AMs2 based on the reference drive signal aA input from the reference drive signal output circuit 510, and outputs the amplification modulation signal AMs2 from the midpoint CP1.

The pulse modulation circuit 561 generates a modulation signal Ms2 by pulse-modulating the reference drive signal aA input from the reference drive signal output circuit 510, and outputs the generated modulation signal Ms2 to the second digital amplifier circuit 560. Specifically, the pulse modulation circuit 561 compares the potential of the input reference drive signal aA with the potential of a biased triangular wave signal in which a DC voltage is biased to a predetermined triangular wave signal. The pulse modulation circuit 561 outputs the modulation signal Ms2 that is H-level when the potential of the reference drive signal aA is larger than the potential of the predetermined biased triangular wave signal, and is L-level when the potential of the reference drive signal aA is smaller than the potential of the predetermined biased triangular wave signal.

The pulse modulation circuit 551 may generate a pulse density modulation signal (PDM signal) obtained by modulating the reference drive signal aA by a pulse density modulation (PDM) method, and output the PDM signal as the modulation signal Ms2 to the second digital amplifier circuit 560. Here, the biased triangular wave signal used for comparison with the reference drive signal aA in the pulse modulation circuit 561 is a signal in which the potential of the reference drive signal aA corresponding to the case where the potential of the drive signal COM is the potential of the voltage VMV is biased to the triangular wave signal used for comparison with the reference drive signal aA in the pulse modulation circuit 551. That is, the biased triangular wave signal used for comparison with the reference drive signal aA in the pulse modulation circuit 561 is a signal that changes between the potential of the reference drive signal aA corresponding to the case where the potential of the drive signal COM is the potential of the voltage VMV and a potential obtained by doubling the potential of the reference drive signal aA corresponding to the case where the potential of the drive signal COM is the potential of the voltage VMV.

The modulation signal Ms2 output by the pulse modulation circuit 561 is input to the gate driver 562. The gate driver 562 outputs a gate signal Hgs2 for driving the transistor Q3 and a gate signal Lgs2 for driving the transistor Q4 based on the logic level of the input modulation signal Ms2. That is, the gate driver 562 outputs the gate signal Hgs2 and the gate signal Lgs2 based on the reference drive signal aA which is the reference of the drive signal COM.

The transistors Q3 and Q4 are both configured to include N-channel MOS-FETs. The gate signal Hgs2 output by the gate driver 562 is input to a gate terminal of the transistor Q3. The voltage Vmb output by the bootstrap circuit BS4 is supplied to a drain terminal of the transistor Q3, and the source terminal is coupled to a midpoint CP2. In addition, the gate signal Lgs2 output by the gate driver 562 is input to a gate terminal of the transistor Q4. A drain terminal of the transistor Q4 is coupled to the midpoint CP2, and a source terminal of the transistor Q4 is coupled to the midpoint CP1.

That is, in the transistor Q3, the voltage Vmb output by the bootstrap circuit BS4 is supplied to the drain terminal at one end, the source terminal at the other end is electrically coupled to the midpoint CP2, and the transistor Q3 is driven based on the gate signal Hgs2. In the transistor Q4, the drain terminal at one end is electrically coupled to the midpoint CP2, the source terminal at the other end is electrically coupled to the midpoint CP1, and the transistor Q4 is driven based on the gate signal Lgs2. The second digital amplifier circuit 560 outputs the generated signal to the midpoint CP2 to which the transistor Q3 and the transistor Q4 are coupled as the amplification modulation signal AMs2.

Here, the operation of the gate driver 562 that outputs the gate signal Hgs2 and the gate signal Lgs2 based on the modulation signal Ms2 will be described. The gate driver 562 includes gate drive circuits 563 and 564 and an inverter circuit 565. The modulation signal Ms2 input to the gate driver 562 is input to the gate drive circuit 563 and also input to the gate drive circuit 564 via the inverter circuit 565. That is, the signal input to the gate drive circuit 563 and the signal input to the gate drive circuit 564 are exclusively at the H-level. Here, the signal that is exclusively H-level means that the H-level signal is not simultaneously input to the gate drive circuit 563 and the gate drive circuit 564. That is, it does not exclude when the L-level signal is simultaneously input to the gate drive circuit 563 and the gate drive circuit 564.

A low potential side power supply terminal of the gate drive circuit 563 is coupled to the midpoint CP2. Therefore, the potential signal of the midpoint CP2 is supplied as a voltage HVss2 to the low potential side power supply terminal of the gate drive circuit 563. In addition, the high potential side power supply terminal of the gate drive circuit 563 is coupled to the cathode terminal of the diode D2 in which the voltage Vmb output by the bootstrap circuit BS4 described later is supplied to the anode terminal, and is also coupled to one end of the capacitor C2. The other end of the capacitor C2 is coupled to the midpoint CP2. That is, the high potential side input terminal of the gate drive circuit 563 is configured to include a bootstrap circuit BS2 including a capacitor C2 that functions as a bootstrap capacitor. In other words, the second digital amplifier circuit 560 includes the capacitor C2 of which one end is electrically coupled to the midpoint CP2 and the other end is electrically coupled to the gate driver 562, the diode D2 in which a voltage Vmb is supplied to the anode terminal and the cathode terminal is electrically coupled to the other end of the capacitor C2, and the bootstrap circuit BS2 that supplies the voltage HVdd2 to the gate driver 562. The voltage HVdd2 having a potential larger than the voltage HVss2 only by the voltage Vmb is supplied to the high potential side input terminal of the gate drive circuit 563 by the bootstrap circuit BS2 configured as described above, with the voltage HVss2 which is the potential of the midpoint CP2 as a reference potential.

As described above, when the H-level modulation signal Ms2 is input to the gate drive circuit 563, the gate drive circuit 563 outputs the H-level gate signal Hgs2 having a potential based on the voltage HVdd2 which is larger than the potential of the midpoint CP2 by a voltage Vmb. When the L-level modulation signal Ms2 is input to the gate drive circuit 563, the gate drive circuit 563 outputs the L-level gate signal Hgs2 having a potential based on the voltage HVss2 which is the potential of the midpoint CP2.

The low potential side power supply terminal of the gate drive circuit 564 is coupled to the midpoint CP1. Therefore, the potential signal of the midpoint CP1 is supplied as the voltage LVss2 to the low potential side power supply terminal of the gate drive circuit 564. In addition, the high potential side power supply terminal of the gate drive circuit 564 is coupled to the cathode terminal of the diode D3 in which the voltage Vmb output by the bootstrap circuit BS4 described later is supplied to the anode terminal, and is also coupled to one end of the capacitor C3. The other end of the capacitor C3 is coupled to the midpoint CP1. That is, the high potential side input terminal of the gate drive circuit 564 is configured to include a bootstrap circuit BS3 including a capacitor C3 that functions as a bootstrap capacitor. In other words, the second digital amplifier circuit 560 includes the capacitor C3 of which one end is electrically coupled to the midpoint CP1 and the other end is electrically coupled to the gate driver 562, the diode D3 in which a voltage Vmb is supplied to the anode terminal and the cathode terminal is electrically coupled to the other end of the capacitor C3, and the bootstrap circuit BS3 that supplies the voltage LVdd2 to the gate driver 562. The voltage LVdd2 having a potential larger than the voltage LVss2 only by the voltage Vmb is supplied to the low potential side power supply terminal of the gate drive circuit 564 by the bootstrap circuit BS3, with the voltage LVss2 which is the potential of the midpoint CP1 as a reference potential.

As described above, when the H-level signal in which the logic level of the L-level modulation signal Ms2 is inverted by the inverter circuit 565 is input to the gate drive circuit 564, the gate drive circuit 564 outputs an H-level gate signal Lgs2 having a potential based on the voltage LVdd2, which is larger than the potential of the midpoint CP1 by a voltage Vmb. When the L-level signal in which the logic level of the H-level modulation signal Ms2 is inverted by the inverter circuit 565 is input to the gate drive circuit 564, the gate drive circuit 564 outputs an L-level gate signal Lgs2 having a potential based on the voltage LVss2, which is the potential of the midpoint CP1.

The bootstrap circuit BS4 includes a diode D4 and a capacitor C4. A voltage VMV is supplied to the anode terminal of the diode D4, and the cathode terminal of the diode D4 is electrically coupled to one end of the capacitor C4. In addition, the other end of the capacitor C4 is electrically coupled to the midpoint CP1. The bootstrap circuit BS4 outputs the voltage Vmb from a coupling point where the cathode terminal of the diode D4 and one end of the capacitor C4 are coupled to each other. That is, the voltage VMV and the amplification modulation signal AMs1 output to the midpoint CP1 are input to the bootstrap circuit BS4. The bootstrap circuit BS4 generates a voltage Vmb having a potential obtained by adding the potential of the amplification modulation signal AMs1 to the potential of the voltage VMV, and outputs the voltage Vmb to the drain terminal of the transistor Q3 and the anode terminals of each of the diodes D1, D2, and D3. In other words, the bootstrap circuit BS4 includes the capacitor C4 electrically coupled to the first digital amplifier circuit 550 and the second digital amplifier circuit 560 and electrically coupled to the midpoint CP1, and the diode D4 in which a voltage VMV is supplied to the anode terminal and the cathode terminal is coupled to the capacitor C4. The bootstrap circuit BS4 supplies the potential signal of the coupling point between the cathode terminal of the diode D4 and the capacitor C4 as a voltage Vmb to the drain terminal of the transistor Q3 and the bootstrap circuits BS1, BS2, and BS3.

The demodulation circuit 580 demodulates the amplification modulation signal AMs2 output from the second digital amplifier circuit 560 by smoothing the amplification modulation signal AMs2, and outputs the drive signal COM. The demodulation circuit 580 includes an inductor L1 and a capacitor C5. One end of the inductor L1 is electrically coupled to the midpoint CP2, and the other end is electrically coupled to one end of the capacitor C5. A ground potential GND is supplied to the other end of the capacitor C5. That is, the inductor L1 and the capacitor C5 form a low-pass filter circuit. As a result, the amplification modulation signal AMs2 output from the second digital amplifier circuit 560 is smoothed and output from the drive signal output circuit 50 as the drive signal COM.

As described above, in the drive signal output circuit 50 of the present embodiment, the pulse modulation circuit 551 outputs the modulation signal Ms1 generated based on the reference drive data dA, and the pulse modulation circuit 561 outputs the modulation signal Ms2 generated based on the reference drive data dA. Specifically, the pulse modulation circuit 551 compares the potential of the reference drive signal aA with the potential of the triangular wave signal, outputs the modulation signal Ms1 of a logic level according to the comparison result, and the pulse modulation circuit 561 compares the potential of the reference drive signal aA with the potential of the biased triangular wave signal, and outputs the modulation signal Ms1 of a logic level according to the comparison result.

Specifically, when the potential of the reference drive signal aA is lower than the maximum potential of the triangular wave signal, that is, when the potential of the drive signal COM is lower than the potential of the voltage VMV, the pulse modulation circuit 551 outputs the modulation signal Ms1 of a logic level corresponding to the input reference drive signal aA, and the pulse modulation circuit 561 outputs an L-level modulation signal Ms2. On the other hand, when the potential of the reference drive signal aA is higher than the maximum potential of the triangular wave signal, that is, when the potential of the drive signal COM is higher than the potential of the voltage VMV, the pulse modulation circuit 551 outputs the H-level modulation signal Ms1, and the pulse modulation circuit 561 outputs the modulation signal Ms2 of a logic level corresponding to the input reference drive signal aA.

When the potential of the drive signal COM is lower than the potential of the voltage VMV, the transistors Q1 and Q2 included in the first digital amplifier circuit 550 perform a switching operation according to the logic level of the modulation signal Ms1, the transistor Q3 included in the second digital amplifier circuit 560 continues to be non-conductive, and the transistor Q4 included in the second digital amplifier circuit 560 continues to be conductive. As a result, the amplification modulation signal AMs1 obtained by amplifying the modulation signal Ms1 with the voltage VMV is output to the midpoint CP1. The amplification modulation signal AMs1 output to the midpoint CP1 is output as the amplification modulation signal AMs2 from the midpoint CP2 via the transistor Q3 which is controlled to be conductive.

On the other hand, when the potential of the drive signal COM is higher than the potential of the voltage VMV, the transistor Q1 included in the first digital amplifier circuit 550 continues to be conductive, the transistor Q2 included in the first digital amplifier circuit 550 continues to be non-conductive, and the transistors Q3 and Q4 included in the second digital amplifier circuit 560 perform a switching operation according to the logic level of the modulation signal Ms2. As a result, a constant amplification modulation signal AMs1 at the voltage VMV is output to the midpoint CP1. In the period during which the transistor Q3 is controlled to be non-conductive and the transistor Q4 is controlled to be conductive based on the modulation signal Ms2, the amplification modulation signal AMs2 of the potential of the voltage VMV, which is the potential of the amplification modulation signal AMs1 output to the midpoint CP1, is output to the midpoint CP2. In the period during which the transistor Q3 is controlled to be conductive and the transistor Q4 is controlled to be non-conductive based on the modulation signal Ms2, the amplification modulation signal AMs2 having a potential of twice the voltage VMV obtained by adding the potential of the voltage VMV supplied to the anode terminal of diode D4 to the potential of the amplification modulation signal AMs1 output to midpoint CP1 by the bootstrap circuit BS4 is output to the midpoint CP2.

The demodulation circuit 580 smooths and demodulates the amplification modulation signal AMs2 output from the midpoint CP2, so that the drive signal COM that changes between the ground potential and the potential of the double voltage VMV in the period T is demodulated and output from the drive signal output circuit 50.

Here, the first digital amplifier circuit 550 is an example of the first switching circuit, the amplification modulation signal AMs1 output by the first digital amplifier circuit 550 is an example of the first pulse signal, and the midpoint CP1 at which the first digital amplifier circuit 550 outputs the amplification modulation signal AMs1 is an example of the first output point. The gate driver 552 included in the digital amplifier circuit 550 is an example of the first gate driver, the gate signal Hgs1 output by the gate driver 552 is an example of the first gate signal, the gate signal Lgs1 is an example of the second gate signal, the transistor Q1 driven by the gate signal Hgs1 is an example of the first transistor, and the transistor Q2 driven by the gate signal Lgs1 is an example of the second transistor.

In addition, the second digital amplifier circuit 560 is an example of the second switching circuit, the amplification modulation signal AMs2 output by the second digital amplifier circuit 560 is an example of the second pulse signal, and the midpoint CP2 at which the second digital amplifier circuit 560 outputs the amplification modulation signal AMs2 is an example of the second output point. The gate driver 562 included in the digital amplifier circuit 560 is an example of the second gate driver, the gate signal Hgs2 output by the gate driver 562 is an example of the third gate signal, the gate signal Lgs2 is an example of the fourth gate signal, the transistor Q3 driven by the gate signal Hgs2 is an example of the third transistor, and the transistor Q4 driven by the gate signal Lgs2 is an example of the fourth transistor.

The bootstrap circuit BS1 included in the first digital amplifier circuit 550 is an example of the fourth bootstrap circuit, the capacitor C1 included in the bootstrap circuit BS1 is an example of the fourth capacitive element, and the diode D4 included in the bootstrap circuit BS1 is an example of the sixth diode. In addition, the bootstrap circuit BS2 included in the second digital amplifier circuit 560 is an example of the second bootstrap circuit, the capacitor C2 included in the bootstrap circuit BS2 is an example of the second capacitive element, and the diode D2 included in the bootstrap circuit BS2 is an example of the second diode. In addition, the bootstrap circuit BS3 included in the second digital amplifier circuit 560 is an example of the third bootstrap circuit, the capacitor C3 included in the bootstrap circuit BS3 is an example of the third capacitive element, and the diode D3 included in the bootstrap circuit BS3 is an example of the fourth diode. The bootstrap circuit BS4 included in the drive signal output circuit 50 and electrically coupled to the first digital amplifier circuit 550 and the second digital amplifier circuit 560 is an example of the first bootstrap circuit, the capacitor C4 included in the bootstrap circuit BS4 is an example of the first capacitive element, and the diode D4 included in the bootstrap circuit BS4 is an example of the first diode.

In addition, the voltage Vmb is an example of the first voltage, the voltage VMV is an example of the second voltage, the voltage HVdd2 is an example of the third voltage, the voltage LVdd2 is an example of the fourth voltage, and the voltage HVdd1 is an example of the fifth voltage.

1.4 Effects

As described above, in the drive signal output circuit 50 of the present embodiment, the first digital amplifier circuit 550 and the second digital amplifier circuit 560 are coupled to each other in a multi-stage configuration. Therefore, the first digital amplifier circuit 550 and the second digital amplifier circuit 560 can amplify the modulation signals Ms1 and Ms2 based on the voltage VMV smaller than the maximum potential of the drive signal COM. As a result, the withstand voltage of the transistors Q1, Q2, Q3, and Q4 can be reduced, and as a result, the on-resistance of the transistors Q1, Q2, Q3, and Q4 can be reduced. Therefore, the power loss generated by the transistors Q1, Q2, Q3, and Q4 can be reduced, and the power consumption of the drive signal output circuit 50 and the liquid ejecting apparatus 1 having the drive signal output circuit 50 can be reduced.

However, when the first digital amplifier circuit 550 and the second digital amplifier circuit 560 are coupled to each other in a multi-stage configuration, in a case in which the drive signal output circuit 50 continues to be in a constant output state, the electric charges stored in the capacitor C1 included in the bootstrap circuit BS1 for generating the gate signal Hgs1 for driving the transistor Q1, the capacitor C2 included in the bootstrap circuit BS2 for generating the gate signal Hgs2 for driving the transistor Q3, or the capacitor C2 included in the bootstrap circuit BS3 for generating the gate signal Lgs2 for driving the transistor Q4 are released due to a leak current or the like. As a result, the drive characteristics of the transistor corresponding to the capacitor whose electric charge is released may deteriorate.

In response to such a problem, in the drive signal output circuit 50 of the present embodiment, the anode terminal of the diode D1 included in the bootstrap circuit BS1, the anode terminal of the diode D2 included in the bootstrap circuit BS2, and the anode terminal of the diode D3 included in the bootstrap circuit BS3 are set to the voltage Vmb output by the bootstrap circuit BS4 commonly coupled to the first digital amplifier circuit 550 and the second digital amplifier circuit 560. Therefore, the voltage value supplied to the bootstrap circuit BS1, the bootstrap circuit BS2, and the bootstrap circuit BS3 can be increased. As a result, The possibility that the voltage across each of the capacitor C1 included in the bootstrap circuit BS1, the capacitor C2 included in the bootstrap circuit BS2, and the capacitor C3 included in the bootstrap circuit BS3 falls below the threshold voltage of the corresponding transistors Q1, Q3 and Q4 is reduced, and the possibility that the drive characteristics of the transistor are deteriorated is reduced. As a result, the waveform accuracy of the amplification modulation signals AMs1 and AMs2 is improved, and the waveform accuracy of the drive signal COM generated by demodulating the amplification modulation signal AMs2 is improved.

2. Second Embodiment

Next, a drive signal output circuit 50 included in a liquid ejecting apparatus 1 according to a second embodiment will be described. In describing the drive signal output circuit 50 provided in the liquid ejecting apparatus 1 of the second embodiment, the same components as those of the liquid ejecting apparatus 1 and the drive signal output circuit 50 provided in the liquid ejecting apparatus 1 of the first embodiment are designated by the same reference numerals, and the description thereof will be simplified or omitted.

Figure 7:
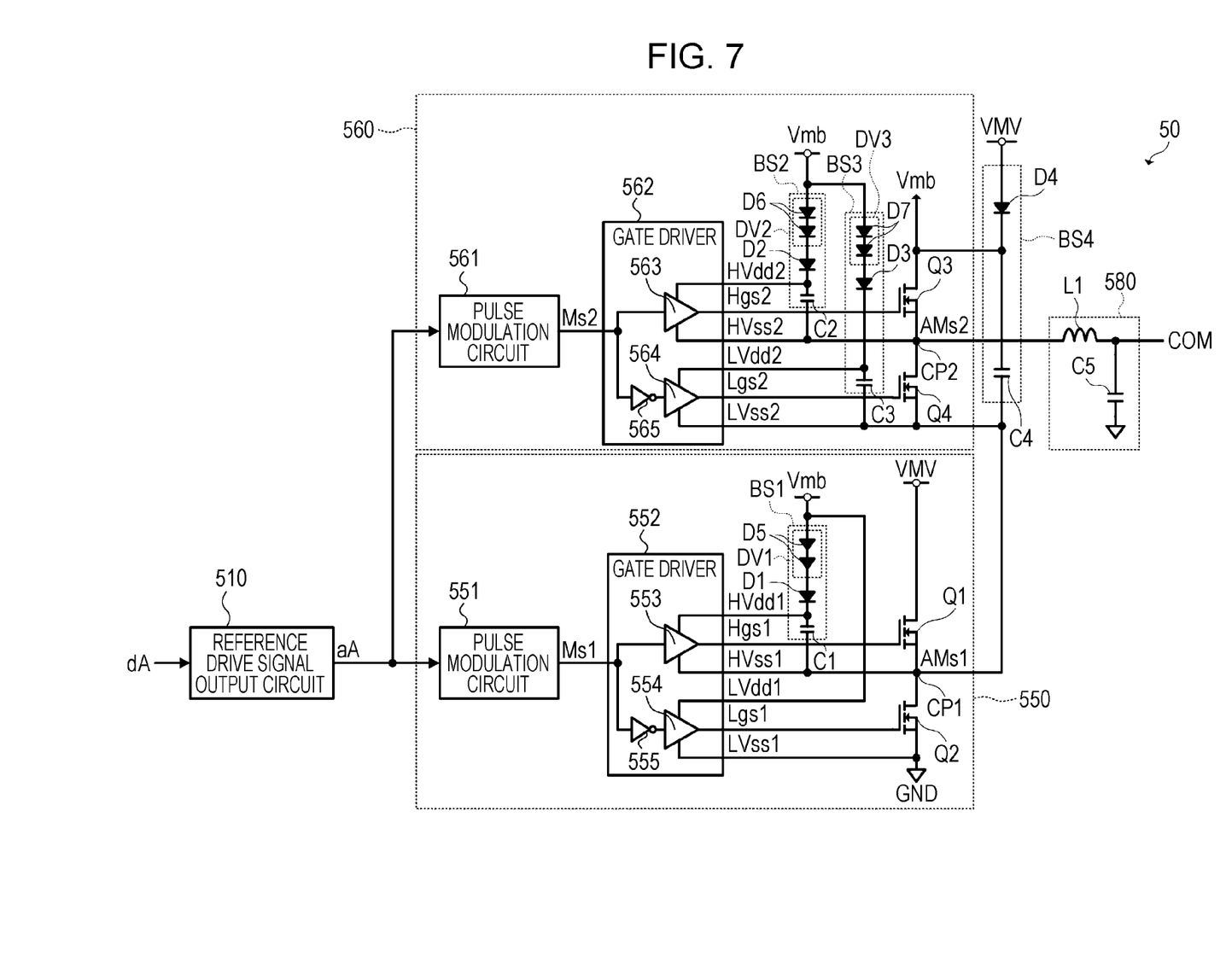
FIG. 7 is a diagram illustrating a functional configuration of a drive signal output circuit according to a second embodiment.

FIG. 7 is a diagram illustrating a functional configuration of the liquid ejecting apparatus 1 according to the second embodiment. As illustrated in FIG. 7, the liquid ejecting apparatus 1 of the second embodiment differs from the drive signal output circuit 50 of the first embodiment in that the bootstrap circuit BS1 included in the drive signal output circuit 50 includes a step-down circuit DV1 in which a plurality of diodes D5 are coupled in series, the bootstrap circuit BS2 includes a step-down circuit DV2 in which a plurality of diodes D6 are coupled in series, and the bootstrap circuit BS3 includes a step-down circuit DV3 in which a plurality of diodes D7 are coupled in series.

Specifically, the voltage Vmb is supplied to the anode terminal of at least one diode D5 among the plurality of diodes D5 included in the step-down circuit DV1 included in the bootstrap circuit BS1. The anode terminals of different diodes D5 among the plurality of diodes D5 are coupled to the cathode terminals of the diode D5 in which the voltage Vmb is supplied to the anode terminals. The cathode terminal of the diode D5 located at the final stage is coupled to the anode terminal of the diode D1. As a result, a voltage having a potential obtained by subtracting a potential corresponding to the sum of the forward voltages of each of the plurality of diodes D5 from the potential of the voltage Vmb is supplied to the anode terminal of the diode D1.

Similarly, the voltage Vmb is supplied to the anode terminal of at least one diode D6 among the plurality of diodes D6 included in the step-down circuit DV2 included in the bootstrap circuit BS2. The anode terminals of different diodes D6 among the plurality of diodes D6 are coupled to the cathode terminals of the diode D6 in which the voltage Vmb is supplied to the anode terminals.

The cathode terminal of the diode D6 located at the final stage is coupled to the anode terminal of the diode D2. As a result, a voltage having a potential obtained by subtracting a potential corresponding to the sum of the forward voltages of each of the plurality of diodes D6 from the potential of the voltage Vmb is supplied to the anode terminal of the diode D2.

Similarly, the voltage Vmb is supplied to the anode terminal of at least one diode D7 among the plurality of diodes D7 included in the step-down circuit DV3 included in the bootstrap circuit BS3. The anode terminals of different diodes D7 among the plurality of diodes D7 are coupled to the cathode terminals of the diode D7 in which the voltage Vmb is supplied to the anode terminals. The cathode terminal of the diode D7 located at the final stage is coupled to the anode terminal of the diode D3. As a result, a voltage having a potential obtained by subtracting a potential corresponding to the sum of the forward voltages of each of the plurality of diodes D7 from the potential of the voltage Vmb is supplied to the anode terminal of the diode D3.

As described above, in the drive signal output circuit 50 of the second embodiment, the bootstrap circuit BS1 includes the step-down circuit DV1 in which the plurality of diodes D5 are coupled in series, a voltage Vmb is supplied to the anode terminal of the diode D1 via the step-down circuit DV1, the bootstrap circuit BS2 includes the step-down circuit DV2 in which the plurality of diodes D6 are coupled in series, a voltage Vmb is supplied to the anode terminal of the diode D2 via the step-down circuit DV2, the bootstrap circuit BS3 includes the step-down circuit DV3 in which the plurality of diodes D7 are coupled in series, and a voltage Vmb is supplied to the anode terminal of the diode D3 via the step-down circuit DV3.

As a result, each of the gate drivers 552 and 562 can output gate signals Hgs1, Lgs1, Hgs2, and Lgs2 having potentials according to the specifications of the transistors Q1, Q2, Q3, and Q4, without providing a power supply circuit for driving the transistors Q1, Q2, Q3, and Q4. As a result, the stability of the operation of the transistors Q1, Q2, Q3, and Q4 is further improved, the waveform accuracy of the amplification modulation signals AMs1 and AMs2 is further improved, and the waveform accuracy of the drive signal COM generated by demodulating the amplification modulation signal AMs2 is further improved.

Here, the step-down circuit DV2 is an example of the first step-down circuit, the step-down circuit DV3 is an example of the second step-down circuit, and the step-down circuit DV1 is an example of the third step-down circuit. In addition, the plurality of diodes D6 included in the step-down circuit DV2 are examples of a plurality of third diodes, the plurality of diodes D7 included in the step-down circuit DV3 are examples of a plurality of fifth diodes, and the plurality of diodes D5 included in the step-down circuit DV1 are examples of a plurality of seventh diodes.

3. Third Embodiment

Next, a drive signal output circuit 50 included in a liquid ejecting apparatus 1 according to a third embodiment will be described. In describing the drive signal output circuit 50 provided in the liquid ejecting apparatus 1 of the third embodiment, the same components as those of the liquid ejecting apparatus 1 and the drive signal output circuit 50 provided in the liquid ejecting apparatus 1 of the first embodiment are designated by the same reference numerals, and the description thereof will be simplified or omitted.

Figure 8:
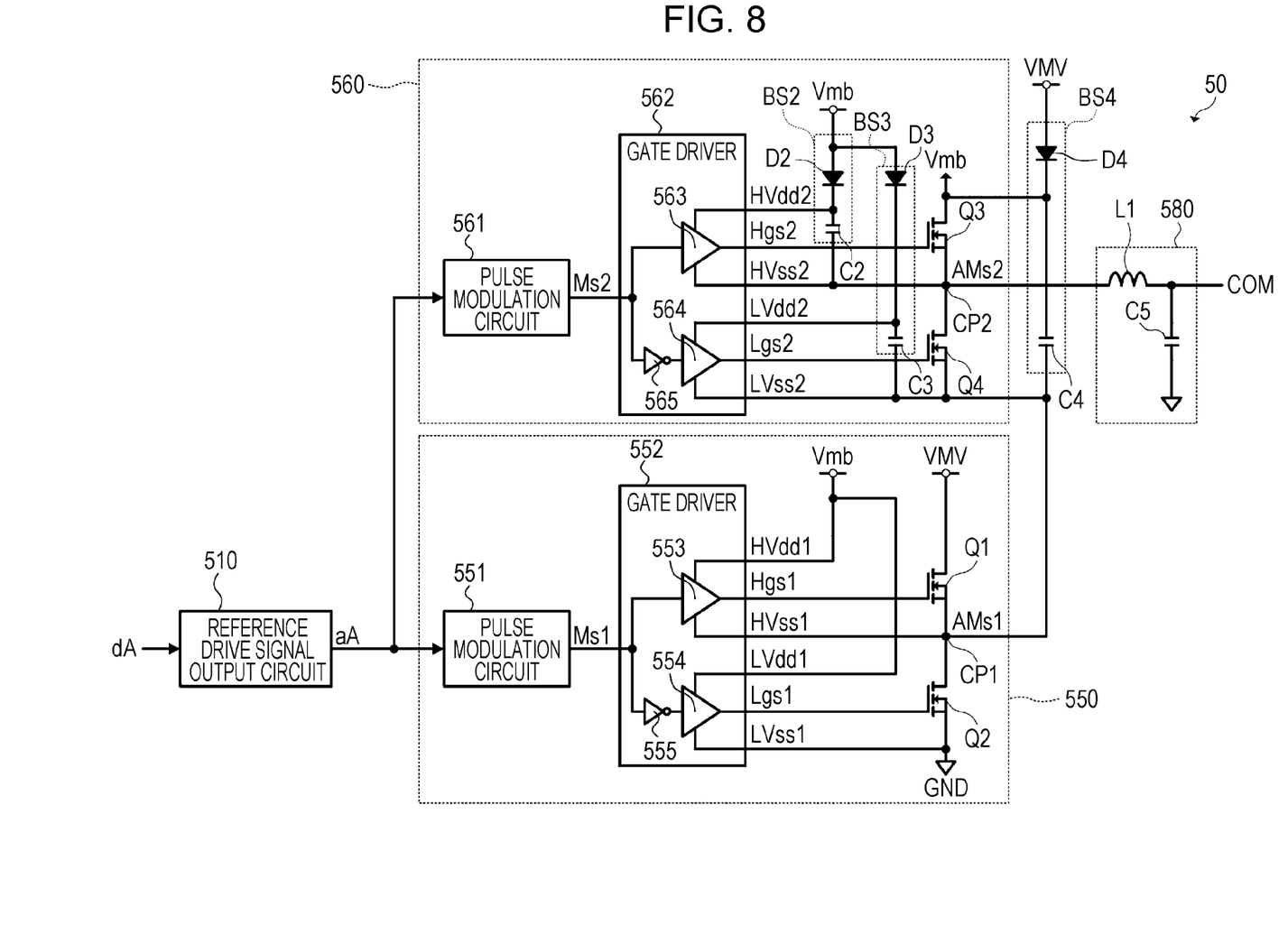
FIG. 8 is a diagram illustrating a functional configuration of a drive signal output circuit according to a third embodiment.

FIG. 8 is a diagram illustrating a functional configuration of the liquid ejecting apparatus 1 according to the third embodiment. As illustrated in FIG. 8, in the liquid ejecting apparatus 1 according to the third embodiment is different from the drive signal output circuit 50 in the first embodiment in that the first digital amplifier circuit 550 does not include the bootstrap circuit BS1 for generating the gate signal Hgs1 for driving the transistor Q1.

Specifically, in the drive signal output circuit 50 according to the third embodiment, the voltage Vmb output by the bootstrap circuit BS4 is directly supplied to the gate driver 552 as the voltage HVdd1 for outputting the gate signal Hgs1. The maximum potential of the amplification modulation signal AMs1 output by the first digital amplifier circuit 550 is smaller than the maximum potential of the amplification modulation signal AMs2 output by the second digital amplifier circuit 560. Therefore, the gate driver 552 included in the first digital amplifier circuit 550 can exert the same effect as the drive signal output circuit 50 illustrated in the first embodiment even when the voltage Vmb output by the bootstrap circuit BS4 is directly supplied as the H-level voltage of the gate signal Hgs1.

Although the embodiments have been described above, the present disclosure is not limited to these embodiments, and can be implemented in various embodiments without departing from the gist thereof. For example, the above embodiments can be combined as appropriate.

The present disclosure includes a configuration substantially the same as the configuration described in the embodiment (for example, a configuration having the same function, method, and result, or a configuration having the same purpose and effect). In addition, the present disclosure also includes a configuration in which a non-essential part of the configuration described in the embodiment is replaced. In addition, the present disclosure also includes a configuration that exhibits the same effects as the configuration described in the embodiment or a configuration that can achieve the same object. In addition, the present disclosure also includes a configuration in which a known technique is added to the configuration described in the embodiment.

The following contents are derived from the above-described embodiment.

According to an aspect, there is provided a drive circuit that outputs a drive signal driving a drive portion, the circuit including a first switching circuit that outputs a first pulse signal from a first output point; a second switching circuit that outputs a second pulse signal from a second output point; a first bootstrap circuit that is electrically coupled to the first switching circuit and the second switching circuit and outputs a first voltage to the second switching circuit; and a smoothing circuit that smooths the second pulse signal and outputs the drive signal, in which the first bootstrap circuit includes a first capacitive element of which one end is electrically coupled to the first output point, and a first diode of which a second voltage is supplied to an anode terminal, and a cathode terminal is electrically coupled to the other end of the first capacitive element, the first switching circuit includes a first gate driver that outputs a first gate signal and a second gate signal based on a reference drive signal which is a reference of the drive signal, a first transistor of which the second voltage is supplied to one end, and the other end is electrically coupled to the first output point, and which is driven based on the first gate signal, and a second transistor of which one end is electrically coupled to the first output point and which is driven based on the second gate signal, the second switching circuit includes a second gate driver that outputs a third gate signal and a fourth gate signal based on the reference drive signal, a third transistor of which the first voltage is supplied to one end, and the other end is electrically coupled to the second output point, and which is driven based on the third gate signal, a fourth transistor of which one end is electrically coupled to the second output point, and the other end is electrically coupled to the first output point, and which is driven based on the fourth gate signal, and a second bootstrap circuit that supplies a third voltage to the second gate driver, and the second bootstrap circuit includes a second capacitive element of which one end is electrically coupled to the second output point and the other end is electrically coupled to the second gate driver, and a second diode of which the first voltage is supplied to an anode terminal and a cathode terminal is electrically coupled to the other end of the second capacitive element.

According to the drive circuit, the possibility that the potential difference between both ends of the second capacitive element included in the second bootstrap circuit is lowered is reduced. As a result, the possibility that the stability of the operation of at least one of the third transistor and the fourth transistor included in the second switching circuit is lowered is reduced. That is, the operation of the third transistor and the fourth transistor is stable, and the operation of the second switching circuit including the third transistor and the fourth transistor is stable. As a result, the accuracy of the second pulse signal output by the second switching circuit is improved, and the accuracy of the drive signal generated by smoothing the second pulse signal is improved. That is, according to the drive circuit, the waveform accuracy of the output drive signal can be improved.

In an aspect of the drive circuit, the second bootstrap circuit may include a first step-down circuit, and the first voltage may be supplied to the anode terminal of the second diode via the first step-down circuit.

According to the drive circuit, the potential of the third voltage output by the second bootstrap circuit can be adjusted. As a result, the potential of at least one of the second gate driver to which the third voltage is supplied and the third gate signal and the fourth gate signal output by the second gate driver based on the second voltage can be adjusted, and at least one of the second gate driver, the third transistor driven by the third gate signal, and the fourth transistor driven by the fourth gate signal can be driven by the optimum drive voltage. As a result, the operation of the second switching circuit including the second gate driver, the third transistor, and the fourth transistor is stable. As a result, the accuracy of the second pulse signal output by the second switching circuit is improved, and the accuracy of the drive signal generated by smoothing the second pulse signal is improved. That is, according to the drive circuit, the waveform accuracy of the output drive signal can be improved.

In addition, according to the drive circuit, at least one of the second gate driver, the third transistor driven by the third gate signal, and the fourth transistor driven by the fourth gate signal can be driven by the optimum drive voltage. Therefore, the possibility of overvoltage abnormality due to the supply of overvoltage to the second gate driver, the third transistor, and the fourth transistor is reduced, and the reliability of the operation of the second switching circuit is improved.

In an aspect of the drive circuit, the first step-down circuit may include a plurality of third diodes coupled in series.

According to the drive circuit, the first step-down circuit can be configured with a simple configuration, and the possibility that the size of the drive circuit is increased can be reduced.

In an aspect of the drive circuit, the second switching circuit may include a third bootstrap circuit that supplies a fourth voltage to the second gate driver, and the third bootstrap circuit may include a third capacitive element of which one end is electrically coupled to the first output point and the other end is electrically coupled to the second gate driver, and a fourth diode of which the first voltage is supplied to an anode terminal and a cathode terminal is electrically coupled to the other end of the third capacitive element.

According to the drive circuit, the possibility that the potential difference between both ends of the third capacitive element included in the third bootstrap circuit is lowered is reduced. As a result, the possibility that the stability of the operation of the third transistor and the fourth transistor included in the second switching circuit is lowered is further reduced. That is, the operation of the third transistor and the fourth transistor is further stable, and the operation of the second switching circuit including the third transistor and the fourth transistor is further stable. As a result, the accuracy of the second pulse signal output by the second switching circuit is further improved, and the accuracy of the drive signal generated by smoothing the second pulse signal is further improved. That is, according to the drive circuit, the waveform accuracy of the output drive signal can be further improved.

In an aspect of the drive circuit, the third bootstrap circuit may include a second step-down circuit, and the first voltage may be supplied to the anode terminal of the fourth diode via the second step-down circuit.

According to the drive circuit, the potential of the fourth voltage output by the third bootstrap circuit can be adjusted. As a result, the potential of at least one of the second gate driver to which the fourth voltage is supplied and the third gate signal and the fourth gate signal output by the second gate driver based on the second voltage can be adjusted, and at least one of the second gate driver, the third transistor driven by the third gate signal, and the fourth transistor driven by the fourth gate signal can be driven by the optimum drive voltage. As a result, the operation of the second switching circuit including the second gate driver, the third transistor, and the fourth transistor is stable. As a result, the accuracy of the second pulse signal output by the second switching circuit is improved, and the accuracy of the drive signal generated by smoothing the second pulse signal is improved. That is, according to the drive circuit, the waveform accuracy of the output drive signal can be improved.

In addition, according to the drive circuit, at least one of the second gate driver, the third transistor driven by the third gate signal, and the fourth transistor driven by the fourth gate signal can be driven by the optimum drive voltage. Therefore, the possibility of overvoltage abnormality due to the supply of overvoltage to the second gate driver, the third transistor, and the fourth transistor is reduced, and the reliability of the operation of the second switching circuit is improved.

In an aspect of the drive circuit, the second step-down circuit may include a plurality of fifth diodes coupled in series.

According to the drive circuit, the second step-down circuit can be configured with a simple configuration, and the possibility that the size of the drive circuit is increased can be reduced.

In an aspect of the drive circuit, the first switching circuit may include a fourth bootstrap circuit that supplies a fifth voltage to the first gate driver, and the fourth bootstrap circuit may include a fourth capacitive element of which one end is electrically coupled to the first output point and the other end is electrically coupled to the first gate driver, and a sixth diode of which the first voltage is supplied to an anode terminal and a cathode terminal is electrically coupled to the other end of the fourth capacitive element.

According to the drive circuit, the possibility that the potential difference between both ends of the fourth capacitive element included in the fourth bootstrap circuit is lowered is reduced. As a result, the possibility that the stability of the operation of at least one of the first transistor and the second transistor included in the second switching circuit is lowered is reduced. That is, the operation of the first transistor and the second transistor is stable, and the operation of the first switching circuit including the first transistor and the second transistor is further stable. As a result, the accuracy of the first pulse signal output by the first switching circuit is further improved, and the accuracy of the drive signal generated by smoothing the second pulse signal based on the first pulse signal is improved. That is, according to the drive circuit, the waveform accuracy of the output drive signal can be further improved.

In an aspect of the drive circuit, the fourth bootstrap circuit may include a third step-down circuit, and the first voltage may be supplied to the anode terminal of the sixth diode via the third step-down circuit.

According to the drive circuit, the potential of the fifth voltage output by the fourth bootstrap circuit can be adjusted. As a result, the potential of at least one of the first gate driver to which the fifth voltage is supplied and the first gate signal and the second gate signal output by the first gate driver based on the fifth voltage can be adjusted, and at least one of the first gate driver, the first transistor driven by the first gate signal, and the second transistor driven by the second gate signal can be driven by the optimum drive voltage. As a result, the operation of the first switching circuit including the first gate driver, the first transistor, and the second transistor is stable. As a result, the accuracy of the first pulse signal output by the first switching circuit is improved, and the accuracy of the drive signal generated by smoothing the first pulse signal is improved. That is, according to the drive circuit, the waveform accuracy of the output drive signal can be improved.

In addition, according to the drive circuit, at least one of the first gate driver, the first transistor driven by the first gate signal, and the second transistor driven by the second gate signal can be driven by the optimum drive voltage. Therefore, the possibility of overvoltage abnormality due to the supply of overvoltage to the first gate driver, the first transistor, and the second transistor is reduced, and the reliability of the operation of the first switching circuit is improved.

In an aspect of the drive circuit, the third step-down circuit may include a plurality of seventh diodes coupled in series.

According to the drive circuit, the third step-down circuit can be configured with a simple configuration, and the possibility that the size of the drive circuit is increased can be reduced.

According to another aspect, there is provided a liquid ejecting apparatus including an ejecting portion that ejects a liquid; and a drive circuit that outputs a drive signal driving the ejecting portion, in which the drive circuit includes a first switching circuit that outputs a first pulse signal from a first output point; a second switching circuit that outputs a second pulse signal from a second output point; a first bootstrap circuit that is electrically coupled to the first switching circuit and the second switching circuit and outputs a first voltage to the second switching circuit; and a smoothing circuit that smooths the second pulse signal and outputs the drive signal, the first bootstrap circuit includes a first capacitive element of which one end is electrically coupled to the first output point, and a first diode of which a second voltage is supplied to an anode terminal, and a cathode terminal is electrically coupled to the other end of the first capacitive element, the first switching circuit includes a first gate driver that outputs a first gate signal and a second gate signal based on a reference drive signal which is a reference of the drive signal, a first transistor of which the second voltage is supplied to one end, and the other end is electrically coupled to the first output point, and which is driven based on the first gate signal, and a second transistor of which one end is electrically coupled to the first output point and which is driven based on the second gate signal, the second switching circuit includes a second gate driver that outputs a third gate signal and a fourth gate signal based on the reference drive signal, a third transistor of which the first voltage is supplied to one end, and the other end is electrically coupled to the second output point, and which is driven based on the third gate signal, a fourth transistor of which one end is electrically coupled to the second output point, and the other end is electrically coupled to the first output point, and which is driven based on the fourth gate signal, and a second bootstrap circuit that supplies a third voltage to the second gate driver, and the second bootstrap circuit includes a second capacitive element of which one end is electrically coupled to the second output point and the other end is electrically coupled to the second gate driver, and a second diode of which the first voltage is supplied to an anode terminal and a cathode terminal is electrically coupled to the other end of the second capacitive element.

According to this liquid ejecting apparatus, in the drive circuit, the possibility that the potential difference between both ends of the second capacitive element included in the second bootstrap circuit is lowered is reduced. As a result, the possibility that the stability of the operation of at least one of the third transistor and the fourth transistor included in the second switching circuit is lowered is reduced. That is, the operation of the third transistor and the fourth transistor is stable, and the operation of the second switching circuit including the third transistor and the fourth transistor is stable. As a result, the accuracy of the second pulse signal output by the second switching circuit is improved, and the accuracy of the drive signal generated by smoothing the second pulse signal is improved. That is, according to the drive circuit, the waveform accuracy of the output drive signal can be improved.

What is claimed is:

1. A drive circuit that outputs a drive signal driving a drive portion, the circuit comprising:
    a first switching circuit that outputs a first pulse signal from a first output point;
    a second switching circuit that outputs a second pulse signal from a second output point;
    a first bootstrap circuit that is electrically coupled to the first switching circuit and the second switching circuit and outputs a first voltage to the second switching circuit; and
    a smoothing circuit that smooths the second pulse signal and outputs the drive signal, wherein
    the first bootstrap circuit includes
    a first capacitive element of which one end is electrically coupled to the first output point, and
    a first diode of which a second voltage is supplied to an anode terminal, and a cathode terminal is electrically coupled to the other end of the first capacitive element,
    the first switching circuit includes
    a first gate driver that outputs a first gate signal and a second gate signal based on a reference drive signal which is a reference of the drive signal,
    a first transistor of which the second voltage is supplied to one end, and the other end is electrically coupled to the first output point, and which is driven based on the first gate signal, and
    a second transistor of which one end is electrically coupled to the first output point and which is driven based on the second gate signal,
    the second switching circuit includes
    a second gate driver that outputs a third gate signal and a fourth gate signal based on the reference drive signal,
    a third transistor of which the first voltage is supplied to one end, and the other end is electrically coupled to the second output point, and which is driven based on the third gate signal,
    a fourth transistor of which one end is electrically coupled to the second output point, and the other end is electrically coupled to the first output point, and which is driven based on the fourth gate signal, and
    a second bootstrap circuit that supplies a third voltage to the second gate driver, and
    the second bootstrap circuit includes
    a second capacitive element of which one end is electrically coupled to the second output point and the other end is electrically coupled to the second gate driver, and
    a second diode of which the first voltage is supplied to an anode terminal and a cathode terminal is electrically coupled to the other end of the second capacitive element.

2. The drive circuit according to claim 1, wherein
    the second bootstrap circuit includes a first step-down circuit, and
    the first voltage is supplied to the anode terminal of the second diode via the first step-down circuit.

3. The drive circuit according to claim 2, wherein
    the first step-down circuit includes a plurality of third diodes coupled in series.

4. The drive circuit according to claim 1, wherein
    the second switching circuit includes a third bootstrap circuit that supplies a fourth voltage to the second gate driver, and the third bootstrap circuit includes
a third capacitive element of which one end is electrically coupled to the first output point and the other end is electrically coupled to the second gate driver, and
a fourth diode of which the first voltage is supplied to an anode terminal and a cathode terminal is electrically coupled to the other end of the third capacitive element.

5. The drive circuit according to claim 4, wherein
the third bootstrap circuit includes a second step-down circuit, and
the first voltage is supplied to the anode terminal of the fourth diode via the second step-down circuit.

6. The drive circuit according to claim 5, wherein
the second step-down circuit includes a plurality of fifth diodes coupled in series.

7. The drive circuit according to claim 1, wherein
the first switching circuit includes a fourth bootstrap circuit that supplies a fifth voltage to the first gate driver, and
the fourth bootstrap circuit includes
a fourth capacitive element of which one end is electrically coupled to the first output point and the other end is electrically coupled to the first gate driver, and
a sixth diode of which the first voltage is supplied to an anode terminal and a cathode terminal is electrically coupled to the other end of the fourth capacitive element.

8. The drive circuit according to claim 7, wherein
the fourth bootstrap circuit includes a third step-down circuit, and
the first voltage is supplied to the anode terminal of the sixth diode via the third step-down circuit.

9. The drive circuit according to claim 8, wherein
the third step-down circuit includes a plurality of seventh diodes coupled in series.

10. A liquid ejecting apparatus comprising:
an ejecting portion that ejects a liquid; and
a drive circuit that outputs a drive signal driving the ejecting portion, wherein
the drive circuit includes
a first switching circuit that outputs a first pulse signal from a first output point,
a second switching circuit that outputs a second pulse signal from a second output point,
a first bootstrap circuit that is electrically coupled to the first switching circuit and the second switching circuit and outputs a first voltage to the second switching circuit, and
a smoothing circuit that smooths a second pulse signal and outputs the drive signal,
the first bootstrap circuit includes
a first capacitive element of which one end is electrically coupled to the first output point, and
a first diode of which a second voltage is supplied to an anode terminal, and a cathode terminal is electrically coupled to the other end of the first capacitive element,
the first switching circuit includes
a first gate driver that outputs a first gate signal and a second gate signal based on a reference drive signal which is a reference of the drive signal,
a first transistor of which the second voltage is supplied to one end, and the other end is electrically coupled to the first output point, and which is driven based on the first gate signal, and
a second transistor of which one end is electrically coupled to the first output point and is driven based on the second gate signal,
the second switching circuit includes
a second gate driver that outputs a third gate signal and a fourth gate signal based on the reference drive signal,
a third transistor of which the first voltage is supplied to one end, and the other end is electrically coupled to the second output point, and which is driven based on the third gate signal,
a fourth transistor of which one end is electrically coupled to the second output point, and the other end is electrically coupled to the first output point, and which is driven based on the fourth gate signal, and
a second bootstrap circuit that supplies a third voltage to the second gate driver, and
the second bootstrap circuit includes
a second capacitive element of which one end is electrically coupled to the second output point and the other end is electrically coupled to the second gate driver, and
a second diode of which the first voltage is supplied to an anode terminal and a cathode terminal is electrically coupled to the other end of the second capacitive element.

* * * * *